Sept. 19, 1961 H. D. FRAZIER 3,001,110

COAXIAL SEMICONDUCTORS

Filed Nov. 3, 1960

HENRY D. FRAZIER,
INVENTOR.

BY HIS ATTORNEYS.

Spensley & Horn 3,001,110
Patented Sept. 19, 1961

3,001,110

COAXIAL SEMICONDUCTORS

Henry D. Frazier, Rolling Hills Estates, Calif., assignor to Pacific Semiconductors, Inc., Culver City., Calif., a corporation of Delaware Filed Nov. 3, 1960, Ser. No. 67,082
5 Claims. (Cl. 317—234)

This invention pertains to semiconductor devices and more particularly to mounting and encapsulating structures therefor.

Semiconductor devices are encapsulated to insure consistent operation and long life. Various types of encapsulating structures have been evolved to protect the semiconductive material from chemical contamination and to provide other desirable features, such as good thermal dissipation, shock and vibration resistance, and ease of connection. In present semiconductor encapsulation structures the semiconductive body is mounted to a header plate and enclosed within a cover hermetically sealed to the header plate. Some structures utilize a metallic header plate, electrical connection to the semiconductive body being made through rod type electrodes embedded in glass insulation through the header plate. Other structures utilize a glass header plate, electrical connections to the semiconductor body being made through the use of rod type electrodes passing through the glass header plate.

Due to the small physical size of semiconductor devices, with respect to the amount of electrical power they can handle, it is quite important that the encapsulation structure insure good thermal dissipation by providing an efficient thermal path to an ambient heat sink. An efficient thermal path can be provided by connecting the semiconductor heat source to the ambient heat sink through a heat conductive material of relatively large area, the heat path being kept as short as possible. Attempts to provide an efficient thermal path through utilization of the prior art structural and mounting techniques resulted in relatively large and bulky structures having cumbersome electrical terminals.

It is therefore an object of the present invention to provide improved encapsulated semiconductor devices.

It is also an object of the present invention to provide improved semiconductor mounting and encapsulating structures.

It is a further object of the present invention to provide a compact encapsulated semiconductor device capable of high power dissipation.

It is a still further object of the present invention to provide semiconductor mounting and encapsulating structures having a short thermal path from the semiconductor body to the ambient heat sink.

It is yet another object of the present invention to provide an encapsulated semiconductor device having improved terminals.

It is still another object of the present invention to provide a compact plug-in encapsulated semiconductor device.

It is still another object of the present invention to provide a compact encapsulated semiconductor device having large electrical terminals.

Other objects and a fuller understanding of the invention may be had by referring to the following description and claims, taken in conjunction with the accompanying drawing in which:

Figure 1:
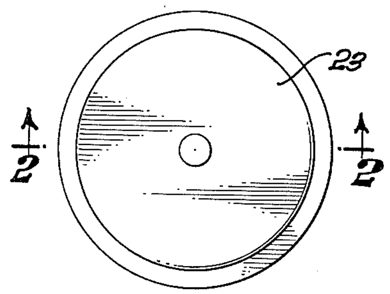
FIGURE 1 shows a top view of a semiconductor device in accordance with one embodiment of the present invention.
Figure 4:
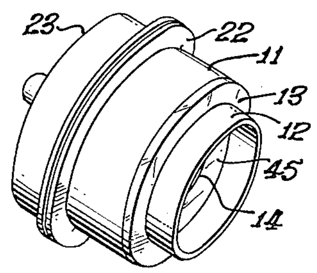
FIGURE 4 is a perspective view of the device of FIGURE 1.
Figure 2:
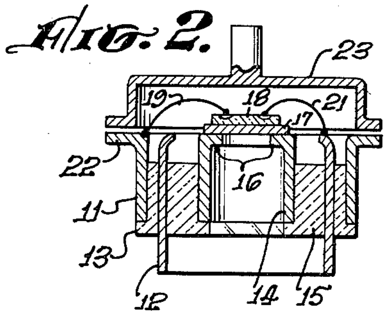
FIGURE 2 is an elevational cross-sectional view taken along the line 2—2 of FIGURE 1.

The objects of the present invention are accomplished by a completely coaxial semiconductor mounting and encapsulating structure, the electrical terminals also being in tubular coaxial form, thereby resulting in a compact plug-in device.

Referring now to FIGURES 1, 2, 3 and 4 of the accompanying drawing there are shown various views of an encapsulated semiconductor device in accordance with one embodiment of the present invention. A first tubular electrode 11 forms the outer coaxial shell of the structure. A second tubular electrode 12 is coaxially disposed within the first electrode 11 and is insulated therefrom by a glass tube 13 which is fused to the surfaces of the electrodes 11 and 12 to form a hermetic seal therebetween.

A third tubular electrode 14 is coaxially disposed within the electrode 12 and insulated therefrom by a glass tube 15 which is fused to the surfaces of the electrodes 12 and 14 to form a hermetic seal therebetween. One end of the electrode 14 is bent inwardly to thereby form a mounting lip portion 16. Sealed to the mounting lip portion 16 of the tubular electrode is a mounting disc 17, to which is mounted a transistor 18. The collector of the transistor 18 is bonded in electrical contact to the mounting disc 17. The base element of the transistor 18 is electrically connected to the first electrode 11 by a wire lead 19, and the emitter element electrically connected to the electrode 12 by a wire lead 21.

One end of the tubular electrode 11 is bent outwardly to thereby form a lip 22. Hermetically sealed to lip 22 is a generally cup-shaped cover 23. Hence the transistor 18 is sealed in an air tight chamber formed by the cover 23 and the sealed coaxial assembly consisting of electrode 11, glass tube 13, electrode 12, glass tube 15, electrode 14 and mounting disc 17.

Although the tubes 13 and 15 are preferably of glass, other vitreous materials or similar nonporous electrical insulating materials could be used. The tubular electrodes are of metal, preferably Kovar, while the cover 23 is preferably of steel or copper. The mounting disc 17 should be of a material having a thermal coefficient of expansion similar to that of the transistor 18, molybdenum having been found suitable for use with a silicon semiconductor body.

Figure 5:
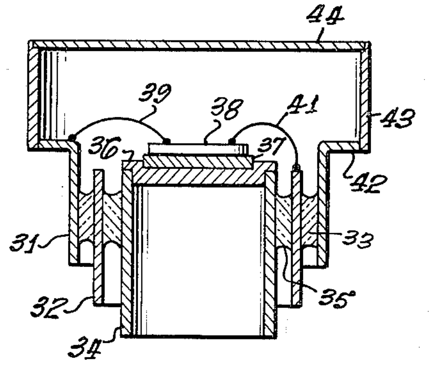
FIGURE 5 is an elevational cross-sectional view of another embodiment of the present invention.
Figure 3:
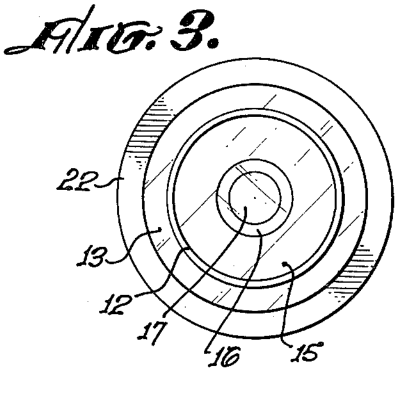
FIGURE 3 is a bottom view of the encapsulated semiconductor device of FIGURE 1.

Referring now to FIGURE 5 there is shown a cross-sectional view in elevation of an alternative embodiment of the coaxial semiconductor mounting and encapsulating structure of the present invention. A first tubular electrode 31 forms the outer coaxial shell of the structure. A second tubular electrode 32 is coaxially disposed within the first electrode 31 and insulated therefrom by a glass seal 33 fused to the surfaces electrodes 31 and 32 to form a hermetic seal therebetween.

A third tubular electrode 34 is coaxially disposed within the electrode 32 and is insulated therefrom by a glass seal 35 fused to the surfaces of the electrodes 32 and 34 to form a hermetic seal therebetween. Sealed to one end of the electrode 34 is a mounting disc 36 to which is mounted a buffering disc 37. Mounted to the buffering 37 is a transistor 38. The collector of the transistor 38 is bonded in electrical contact to the buffering disc 37. The base element of the transistor 38 is electrically connected to the first electrode 31 by a wire lead 39, and the emitter element electrically connected to the electrode 32 by a wire lead 41.

One end of the tubular electrode 31 is bent outwardly to thereby form a lip 42. Hermetically sealed to the lip 42 is a tube 43 having a metallic cover disc 44 hermetically sealed to its open end, the tube 43 and the disc 44 thereby forming a generally cup-shaped closure. Hence the transistor 38 is sealed in an air tight chamber formed by the cover disc 44, the tube 43, and the sealed coaxial assembly consisting of electrode 31, glass tube 33, electrode 32, glass tube 35, electrode 34 and mounting disc 36.

In the embodiment of FIGURE 5 the electrodes 31, 32, and 34 are of Kovar, while the mounting disc 36 is of copper to provide an efficient heat path to the electrode 34. The buffering disc 37 is preferably of a suitable metallized ceramic, such as molybdenum oxide, to match the thermal coefficient of expansion of silicon to that of the copper mounting disc 36. In transistors of lower power ratings the wire leads 19, 21, 39 and 41 can be pigtail leads, while in the larger, very high power transistors these leads can be braided wire straps.

The novel coaxial transistor structure of the present invention provides several advantages over prior art devices. The more efficient heat dissipation characteristics of the device of the present invention enables a reduction in package size for a given power rating. Also, the structure of the electrical contacts enables an increase in contact area for a given package size, as well as simple and convenient electrical connection and disconnection. Although the invention has been described with a certain degree of particularity, it is understood that the present disclosure has been made only by way of example and that numerous changes in the details of construction and the combination and arrangement of parts may be resorted to without departing from the spirit and the scope of the invention as hereinafter claimed.

What is claimed is:

1. In an encapsulated semiconductor device: a first tubular electrode; a second tubular electrode coaxially disposed at least partially within said first electrode and electrically insulated therefrom; a third tubular electrode coaxially disposed at least partially within said second electrode and electrically insulated from said first and second electrodes; a metallic member for mounting a semiconductor body, said member being disposed across one end of said third electrode and in electrical contact therewith; a semiconductor body mounted to said metallic member and in electrical contact therewith; first electrical conducting means connecting said first electrode with a first predetermined active region of said semiconductor body; and second electrical conducting means connecting said second electrode with a second predetermined active region of said semiconductor body.

2. In an encapsulated semiconductor device: a first tubular electrode; a second tubular electrode coaxially disposed at least partially within said first electrode and electrically insulated therefrom; a third tubular electrode coaxially disposed at least partially within said second electrode and electrically insulated from said first and second electrode; a metallic member for mounting a semiconductor device, said member being disposed across one end of said third electrode and in electrical contact therewith; a semiconductor body mounted to said metallic member, said semiconductor body including first, second and third active regions in the surface thereof, said third active region being in electrical contact with said mounting member; first electrical conducting means connecting said first electrode with said first active region of said semiconductor device; and second electrical conducting means connecting said second electrode with said second active region of said semiconductor device.

3. An encapsulated semiconductor device comprising: a first tubular electrode; a second tubular electrode coaxially disposed at least partially within said first electrode and held in fixed relationship thereto by a first tube of a vitreous material interposed therebetween, said first tube providing a hermetic seal between said first and second electrodes; a third tubular electrode coaxially disposed at least partially within said second electrode and held in fixed relationship thereto by a second tube of a vitreous material interposed therebetween, said second tube providing a hermetic seal between said second and third electrodes; a metallic mounting member for mounting a semiconductor device, said member being hermetically sealed across one end of said third electrode and in electrical contact therewith; a semiconductor device having first, second and third active regions in the surface thereof, said semiconductor device mounted to said metallic member with said third active region in electrical contact therewith; first electrical conducting means connecting said first electrode with said first active region of said semiconductor device; second electrical conducting means connecting said second electrode with said second active region of said semiconductor device; and a cup shaped cylindrical closure element hermetically sealed to an end of said first electrode and enclosing therein said mounting member together with said semiconductor device mounted thereon and said first and second electrical conducting means.

4. An encapsulated semiconductor device comprising: a first tubular electrode, a second tubular electrode coaxially disposed at least partially within said first electrode and held in fixed relationship thereto by a first glass tube interposed therebetween, said first tube being bonded to the contacting surfaces of said first and second electrodes to thereby provide a hermetic seal between said first and second electrodes; a third tubular electrode coaxially disposed at least partially within said second electrode and held in fixed relationship thereto by a second glass tube interposed therebetween, said second tube being bonded to the contacting surfaces of said second and third electrodes to thereby provide a hermetic seal between said second and third electrodes; a metallic member for mounting a semiconductor device, said member being hermetically sealed across one end of said third electrode and in electrical contact therewith; a semiconductor device having first, second and third active regions in the surface thereof, said semiconductor device being mounted to said metallic member with said third active region in electrical contact therewith; first electrical conducting means connecting said first electrode with said first active region of said semiconductor device; second electrical conducting means connecting said second electrode with said second active region of said semiconductor device; and a cup shaped cylindrical closure element hermetically sealed to an end of said first electrode and enclosing therein said mounting member together with said semiconductor device mounted thereon and said first and second electrical conducting means.

5. An encapsulated semiconductor device comprising: a first tubular electrode, a second tubular electrode coaxially disposed at least partially within said first electrode and held in fixed relationship thereto by a first glass tube interposed therebetween, said first tube being bonded to the contacting surfaces of said first and second electrodes to thereby provide a hermetic seal between said first and second electrodes; a third tubular electrode coaxially disposed at least partially within said second electrode and held in fixed relationship thereto by a second glass tube interposed therebetween, said second tube being bonded to the contacting surfaces of said second and third electrodes to thereby provide a hermetic seal between said second and third electrodes; a metallic member for mounting a semiconductor device, said member being hermetically sealed across one end of said third electrode and in electrical contact therewith; a transistor having a base, an emitter and a collector, said transistor being mounted to said metallic member with said collector in electrical contact therewith; first electrical means connecting said first electrode with said transistor base; second electrical conducting means connecting said second electrode with said transistor emitter; and a cup shaped cylindrical closure element hermetically sealed to an end of said first electrode and enclosing therein said mounting member together with said transistor mounted thereon and said first and second electrical conducting means.

References Cited in the file of this patent

UNITED STATES PATENTS

| | | |
|---|---|---|
| 2,861,226 | Lootens | Nov. 18, 1958 |
| 2,864,980 | Mueller | Dec. 16, 1958 |
| 2,877,358 | Ross | Mar. 10, 1959 |